United States Patent
Cong et al.

(10) Patent No.: US 11,021,790 B2
(45) Date of Patent: Jun. 1, 2021

(54) LINER FOR PROCESSING CHAMBER

(71) Applicant: Applied Materials, Inc., Santa Clara, CA (US)

(72) Inventors: Zhepeng Cong, San Jose, CA (US); Schubert Chu, San Francisco, CA (US); Nyi O. Myo, San Jose, CA (US); Kartik Shah, Saratoga, CA (US); Surajit Kumar, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 138 days.

(21) Appl. No.: 16/521,826

(22) Filed: Jul. 25, 2019

(65) Prior Publication Data

US 2020/0040451 A1 Feb. 6, 2020

Related U.S. Application Data

(60) Provisional application No. 62/715,258, filed on Aug. 6, 2018.

(51) Int. Cl.
*C23C 16/44* (2006.01)
*C30B 25/08* (2006.01)
(Continued)

(52) U.S. Cl.
CPC ...... *C23C 16/4411* (2013.01); *C23C 16/4583* (2013.01); *C23C 16/46* (2013.01); *C30B 25/08* (2013.01)

(58) Field of Classification Search
CPC . C23C 16/4411; C23C 16/4583; C23C 16/46; C23C 16/4401; C23C 16/44; C30B 25/08
(Continued)

(56) References Cited

U.S. PATENT DOCUMENTS 6,133,550 A * 10/2000 Griffiths ............ H01L 21/67248
219/403
6,277,237 B1 8/2001 Schoepp et al.
(Continued)

FOREIGN PATENT DOCUMENTS

WO 01-22478 A1 3/2001
WO 2011-146108 A2 11/2011

OTHER PUBLICATIONS

International Search Report dated Oct. 30, 2019 for Application No. PCT/US2019/041192.

*Primary Examiner* — Rudy Zervigon
(74) *Attorney, Agent, or Firm* — Patterson + Sheridan LLP

(57) ABSTRACT

Embodiments herein relate to chamber liners with a multi-piece design for use in processing chambers. The multi-piece design can have an inner portion and an outer portion. A portion of the inner surface of the outer portion may be designed to be in contact with the outer surface of the inner portion at a single junction point, creating a thermal barrier between the inner portion and outer portion, thus reducing heat transfer from the inner portion and outer portion. The thermal barrier creates higher temperatures at the chamber liner inner surface and therefore leads to shorter heat up times within the chamber. Additionally, the thermal barrier also creates lower temperatures near the base ring and outer surface of the outer ring, thereby protecting the chamber walls and requiring less thermal regulation/dissipation at the chamber walls.

15 Claims, 5 Drawing Sheets

(51) Int. Cl.
*C23C 16/458* (2006.01)
*C23C 16/46* (2006.01)

(58) Field of Classification Search
USPC .................. 118/715; 156/345.33, 345.34
See application file for complete search history.

(56) References Cited

U.S. PATENT DOCUMENTS

| | | | |
|---|---|---|---|
| 6,355,909 B1* | 3/2002 | Griffiths | C30B 25/10 |
| | | | 219/403 |
| 6,444,037 B1 | 9/2002 | Frankel et al. | |
| 9,322,097 B2* | 4/2016 | Aboagye | C23C 16/4411 |
| 9,532,401 B2 | 12/2016 | Cong et al. | |
| 9,837,250 B2 | 12/2017 | Huston et al. | |
| 9,856,580 B2* | 1/2018 | Sanchez | C30B 25/08 |
| 10,304,703 B2 | 5/2019 | Gouk et al. | |
| 10,519,547 B2* | 12/2019 | Ramanathan | C23C 16/4583 |
| 10,883,190 B2* | 1/2021 | Tong | C30B 25/10 |
| 10,914,007 B2* | 2/2021 | Song | C23C 16/46 |
| 2007/0091535 A1 | 4/2007 | Noorbakhsh et al. | |
| 2008/0178797 A1 | 7/2008 | Fodor et al. | |
| 2011/0226739 A1 | 9/2011 | Allen et al. | |
| 2012/0164323 A1* | 6/2012 | Bhusarapu | C23C 16/4401 |
| | | | 427/213 |
| 2014/0261185 A1* | 9/2014 | Aboagye | C23C 16/45563 |
| | | | 118/728 |
| 2014/0287170 A1 | 9/2014 | Ranish et al. | |
| 2014/0345525 A1* | 11/2014 | Ranish | C23C 16/481 |
| | | | 118/715 |
| 2014/0345526 A1* | 11/2014 | Ranish | H01L 21/02293 |
| | | | 118/715 |
| 2015/0162230 A1* | 6/2015 | Bautista | C30B 25/10 |
| | | | 118/725 |
| 2015/0368830 A1* | 12/2015 | Brillhart | C30B 25/08 |
| | | | 118/728 |
| 2016/0068959 A1 | 3/2016 | Lau et al. | |
| 2016/0068997 A1 | 3/2016 | Lau et al. | |
| 2017/0098555 A1 | 4/2017 | Gouk et al. | |
| 2018/0298495 A1* | 10/2018 | Song | C23C 16/458 |
| 2020/0040451 A1* | 2/2020 | Cong | C23C 16/4583 |

* cited by examiner

LINER FOR PROCESSING CHAMBER

CROSS-REFERENCE TO RELATED APPLICATIONS

This application claims priority to U.S. Provisional Patent Application No. 62/715,258, filed Aug. 6, 2018, which is herein incorporated by reference in its entirety.

BACKGROUND

Field

Embodiments described herein generally relate to liners for use in processing chambers and, more particularly, to thermal barrier liners with a multi-piece design for use in epitaxial processing chambers.

Description of the Related Art

Processing chambers used in the fabrication of semiconductor devices and other electronic or display devices, including epitaxial thermal processing chambers, are particularly useful to deposit dielectric films on substrates. In a conventional thermal chemical vapor deposition (CVD) process, reactive gases are supplied to the substrate surface where heat-induced chemical reactions take place to produce the desired film. Reaction rates may be controlled by controlling the temperature of the chamber.

Processing chambers useful to deposit certain films, such as dielectric films, operate at very high temperatures during processing and at even higher temperatures during chamber cleaning processes. However, these high temperatures can be detrimental to the metallic walls of the processing chambers.

To shield the metallic walls from high temperatures, liners, such as thermal barrier liners, have been used inside the processing chambers. The liners are typically sized to be nested within or deposited on a base ring that extends from the metallic walls. Heat is often lost across the liners, however, due to the heat transfer between the chamber liner inner surface and the much cooler base ring. This creates lower temperatures at the chamber liner inner surface and leads to longer heat ramp times within the chamber during processing and cleaning of the chambers. It also causes higher temperatures near the base ring, requiring more cooling water to help cool the area. Longer heat ramp times and more cooling water require more energy use, decreasing throughput and increasing the cost of ownership.

Accordingly, there is a need for a liner for use in processing chambers that minimizes heat losses and decreases thermal ramp times within the chamber.

SUMMARY

One or more embodiments described herein provide chamber liners with a multi-piece design for use in thermal processing chambers, such as an epitaxial processing chamber.

In one embodiment, a liner for a processing chamber includes an outer portion having an inner surface and an outer surface; and an inner portion having an inner surface and an outer surface; wherein a portion of the inner surface of the outer portion is in thermal contact with the outer surface of the inner portion at at least one junction point having a contact area between the portion of the inner surface of the outer portion and the outer surface of the inner portion; and the inner portion has a first thermal mass and the outer portion has a second thermal mass, and the first thermal mass is less than the second thermal mass.

In another embodiment, a liner for a processing chamber includes an outer portion with an inner surface and an outer surface; an inner portion with an inner surface and an outer surface; a first coating material disposed on at least a portion of the inner surface of the inner portion; and a second coating material disposed on at least a portion of the outer surface of the inner portion and on at least a portion of the inner surface of the outer portion; wherein a portion of the inner surface of the outer portion is in contact with the outer surface of the inner portion at at least one junction point having a contact area between the portion of the inner surface of the outer portion and the outer surface of the inner portion; and the first coating material has a higher absorption coefficient than the second coating material.

In yet another embodiment, a processing chamber includes a substrate support assembly within a chamber body designed to support a substrate; at least one lamp designed to heat the substrate disposed on the substrate support; a cooling channel configured to receive a cooling fluid into the chamber body; a liner, the liner comprising: an outer portion with an inner surface and an outer surface; an inner portion with an inner surface and an outer surface; a first coating material disposed on at least a portion of the inner surface of the inner portion; and a second coating material disposed on at least a portion of the outer surface of the inner portion and on at least a portion of the inner surface of the outer portion; wherein a portion of the inner surface of the outer portion is in thermal contact with the outer surface of the inner portion at at least one junction point having a contact area between the portion of the inner surface of the outer portion and the outer surface of the inner portion; and the inner portion has a first thermal mass and the outer portion has a second thermal mass, and the first thermal mass is less than the second thermal mass; and the first material having a higher absorption coefficient than the second material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, numerous specific details are set forth to provide a more thorough understanding of the embodiments of the present disclosure. However, it will be apparent to one of skill in the art that one or more of the embodiments of the present disclosure may be practiced without one or more of these specific details. In other instances, well-known features have not been described in order to avoid obscuring one or more of the embodiments of the present disclosure.

Embodiments described herein generally relate to chamber liners for use in processing chambers and, more particularly, to thermal barrier liners with a multi-piece design for use in epitaxial processing chambers. The multi-piece design includes an inner portion and an outer portion with minimal contact provided there between. The inner surface of the inner portion faces the processing region while the outer surface of the outer portion is disposed on a base ring. A portion of the inner surface of the outer liner is designed to have minimal contact with the outer surface of the inner portion, such as at a junction point, creating an air gap between the inner portion and the outer portion. The air gap acts as a thermal barrier between the inner portion and outer portion, reducing the heat transfer between the inner and outer portions and thus reducing the heat transfer between the inner surface of the inner portion and the base ring.

The thermal barrier creates higher temperatures at the chamber liner inner surface and causes shorter heat ramp times within the chamber during substrate processing and chamber cleaning. Additionally, the thermal barrier also creates lower temperatures near the base ring and outer surface of the outer ring, thereby protecting the chamber walls and requiring less thermal regulation/dissipation at the chamber walls.

Further, special coating materials and/or surface finishes may be applied to increase emissivity for the inner surface of the inner portion, increasing the heat absorption of the inner portion and also helping to increase the inner portion surface temperature. In addition, special coating materials and/or surface finishes may be applied to decrease emissivity for the outer surface of the inner portion and the inner surface of the outer portion, decreasing the heat absorption of the outer portion, helping to decrease the surface temperature near the base ring. This provides the same advantages of reducing the energy needed during processing and cleaning, thus increasing throughput and reducing the cost of ownership.

Figure 1:
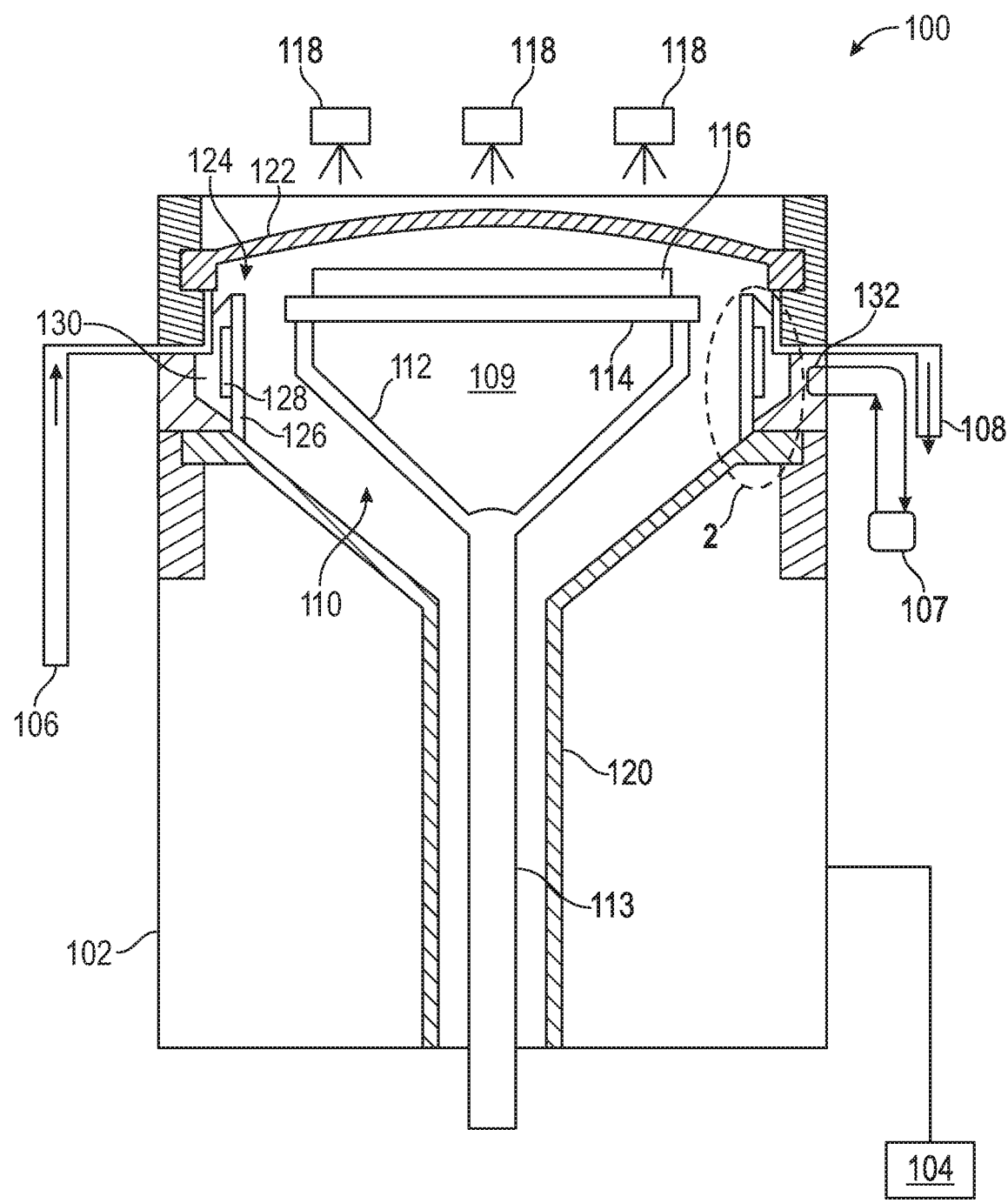
FIG. 1 is a sectional view of a processing chamber according to embodiments described in the present disclosure.

FIG. 1 is a sectional view of a processing chamber 100 according to embodiments described in the present disclosure. By way of example, the processing chamber 100 in FIG. 1 is described in terms of an epitaxial chamber, but any other processing chambers may benefit from the liners described and claimed herein. The processing chamber 100 generally includes a chamber body 102, an upper dome 122, a lower dome 120, and a controller 104. The processing chamber 100 defines a processing region 109 in which a substrate support assembly 110 is disposed. The substrate support assembly 110 includes a susceptor 114, susceptor support 112, and a shaft 113 to move the susceptor 114 within the chamber. A substrate 116 is shown disposed on the upper surface of the susceptor 114. The susceptor support 112 is connected to the shaft 113 at a bottom end and the susceptor 114 at a top end.

The processing chamber 100 may further include a gas channel 106 for delivering gas into the processing region 109 and a gas exhaust system 108 for pumping down the chamber and removing gases from the chamber. The flow of gases into the processing region 109 can be controlled by valves (not shown) such that the gases flow across the surface of the substrate 116. A cooling water channel 107 is formed in the chamber walls to maintain the chamber walls at a desired temperature. The cooling water channel 107 is connected to a cooling fluid supply to facilitate chamber cooling. The processing chamber 100 further includes a plurality of heat sources, such as heating lamps 118 which provide thermal energy to components positioned within the processing chamber 100, including a substrate positioned therein. In this embodiment, the heating lamps 118 may be positioned to provide thermal energy through the upper dome 122 and lower dome 120. The heat sources provide thermal activation of the process gas(es) which results in deposition of a desired film on a substrate 116, e.g., deposition of an epitaxial layer on the substrate 116.

While the heating lamps 118 provide the necessary heat to facilitate thermal activation of the gas(es), the heat can damage the walls of the chamber body 102. A chamber liner 124 is positioned in the processing chamber to protect the chamber body 102 from the high temperatures generated by the heat sources. There can be multiple chamber liners 124 in the processing chamber 100 (two shown in FIG. 1). The chamber liner 124 is disposed in the processing chamber and may be disposed at least partially on a base ring 132. The base ring 132 can be coupled directly to a wall of the chamber body 102. The cooling water channel 107 may travel through the base ring 132 to provide thermal regulation, such as cooling, to the area. As will be described in more detail in FIGS. 2A-2B, the chamber liner 124 may be a multi-piece design including an inner portion 126 and an outer portion 130. The inner portion 126 and outer portion 130 are designed to provide a thermal barrier region 128, such as an air gap, between the inner portion 126 and the outer portion 130. Both the inner portion 126 and the outer portion 130 can be made of quartz, although other similar materials can be used.

Figure 2:
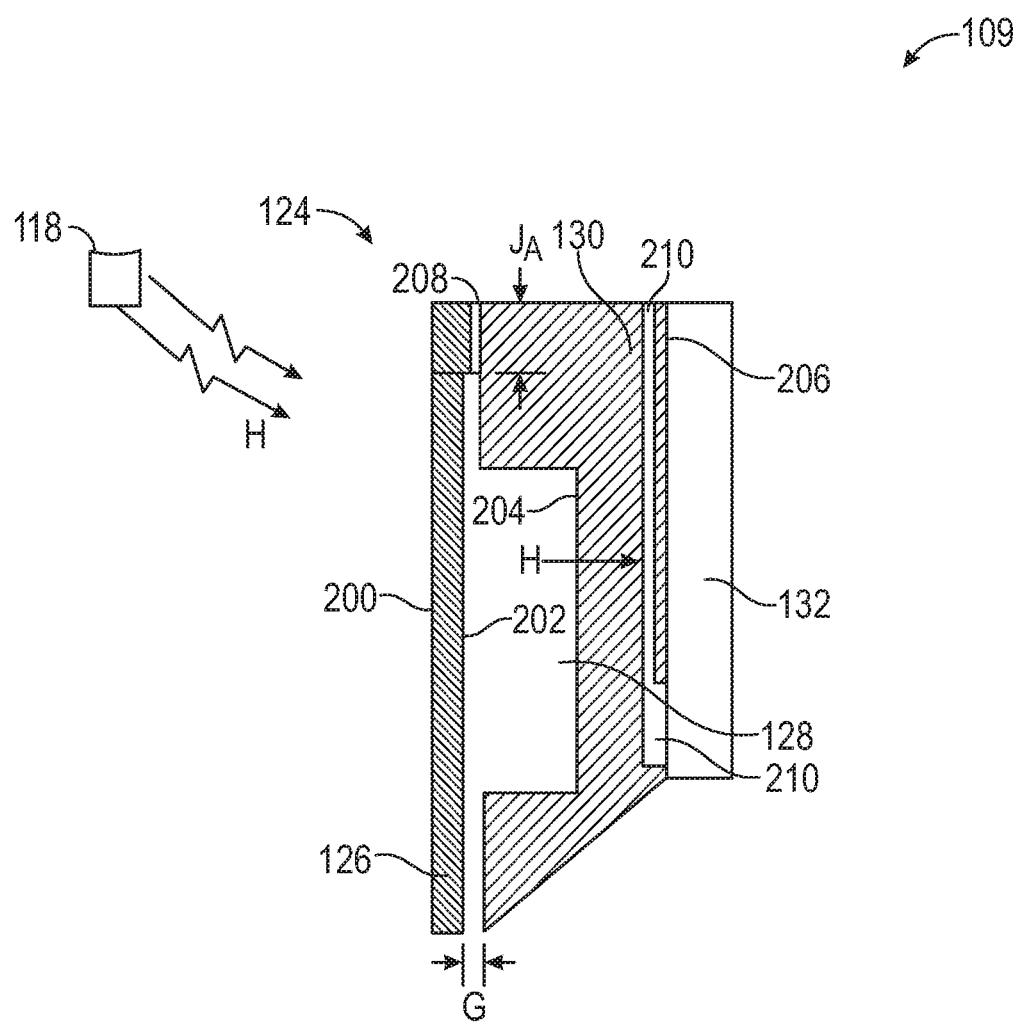
FIG. 2 is a sectional view of the liner of FIG. 1.

FIG. 2 is a sectional view of the chamber liner 124 of FIG. 1. The chamber liner 124 generally includes an inner portion 126 and an outer portion 130 connected at junction point 208. The inner portion 126 includes an inner surface 200 facing the processing region and an outer surface 202 facing the outer portion 130. The inner surface 200 facing the processing region 109 of the processing chamber 100 is exposed to the thermal radiation provided by the heating lamps 118. The outer portion 130 has an inner surface 204 and an outer surface 206. The outer surface 206 is shaped to follow the contour of the processing chamber and in some embodiments is disposed at least partially on the base ring 132. In at least one embodiment, the outer portion 130 has minimal contact with the base ring 132 to support the chamber liner 124 in the processing chamber 100. The outer surface 206 may form an annular wall along the sidewall of the processing chamber 100 and terminate in an angled portion following the contour of the lower dome 120 and/or base ring 132. Within the outer portion 130, there can be a gap 210 which can act as a gas plenum and gas delivery conduit, as shown in FIG. 2. The pressure, flowrate and the volume of the gases inside the gap 210 create additional thermal resistivity that can be controlled, reducing the heat entering the processing chamber 100.

The inner portion 126 is generally annular shaped with a flange at its upper end forming the junction point 208 on its outer surface 202 defining a contact area $J_4$. The outer portion 130 has a channel formed in its inner surface 204, thereby defining a thermal barrier region 128. Thermal barrier region 128 provides an "air gap" which increases the thermal isolation between the inner portion 126 and the outer portion 130. The air gap acts to reduce the heat transfer, H, from the inner portion 126 to the outer portion 130. Additionally, the thermal barrier region 128 acts to reduce the overall thermal mass of the chamber liner 124, as well as the thermal mass of both the inner portion 126 and the outer portion 130, which decreases the heat losses from the inner portion 126 and the outer portion 130, therefore decreasing the amount of energy needed to heat the inner portion 126 from the heating lamps 118. The thermal mass of the inner portion 126 is less than the thermal mass of outer portion 130. The equation below relates thermal energy to thermal mass:

$$Q = C_{th} \Delta T$$

Q is the thermal energy transferred and ΔT is the change in temperature. As shown by the equation, if there is less thermal mass, then less thermal energy is required to achieve the same change in temperature. Similarly, transferring the same amount of thermal energy with less thermal mass creates a greater change in temperature. Therefore, reducing the thermal mass of the chamber liner 124 can led to faster heat ramps during processing and especially during chamber cleaning while using less energy. Additionally, the inner surface 204 of the outer portion 130 may be shaped to form a gap, G, at the bottom of the chamber liner 124, helping to purge the processing gas(es) within the chamber. The gap is positioned at the bottom of the chamber liner 124 because radiation from the heating lamp 118 will typically not reach that point.

The contact area, $J_4$, of the inner surface 204 at the junction point 208 is sized such that it creates minimum thermal contact between the inner portion 126 and the outer portion 130. While a single contact is discussed, two or more contacts are contemplated as long as the contact area is minimized to provide the thermal isolation necessary to achieve the benefits disclosed herein. The contact area of the inner surface 204 may be less than 20%, 10%, or 5% of the non-contact area of the inner surface 204. The size of the contact area can vary depending on the location of the junction point 208 along the inner portion 126 and the outer portion 130. For example, if the inner portion 126 and outer portion 130 are annular, the radius along the outer surface 202 of the inner portion 126 and the inner surface 204 of the outer portion 130 can change, ultimately changing the contact area depending on the location of the junction point 208.

Figure 3A:
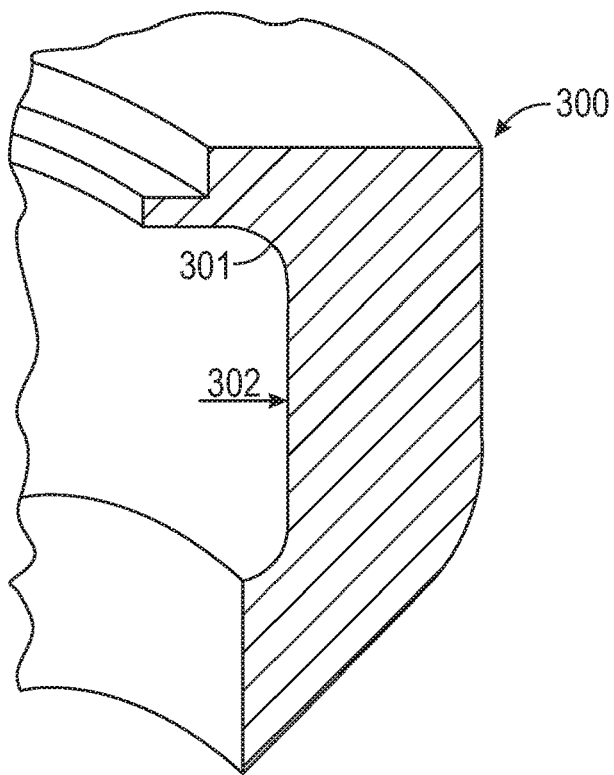
FIG. 3A is a perspective view of a liner as provided in the prior art.
Figure 3B:
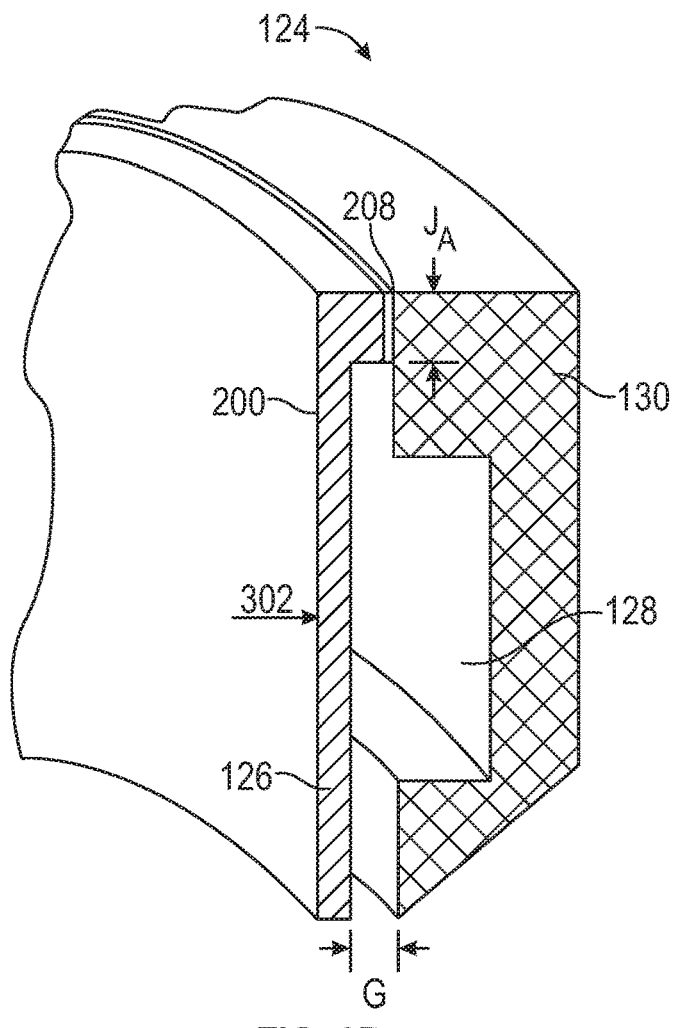
FIG. 3B is a perspective view of the liner of FIG. 1.
Figure 3C:
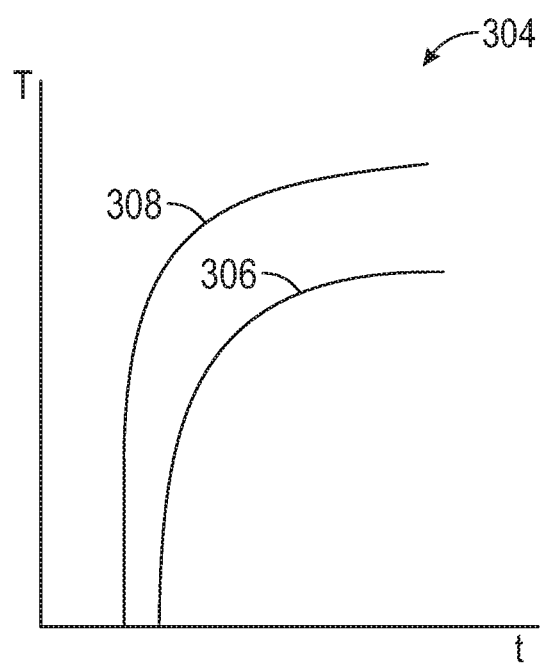
FIG. 3C is a schematic illustration related to the liners of FIGS. 3A and 3B.

FIG. 3C shows the difference between the heat ramp times in a conventional liner 300, as shown in FIG. 3A, and between the chamber liner 124 according to embodiments described herein, and as shown in FIG. 3B. Time is illustrated on the x-axis and temperature is illustrated on the y-axis. The conventional liner 300 is a one piece design, unlike the multi-piece design provided herein. The conventional liner 300 has a greater thermal mass than the inner portion 126 of the chamber liner 124, as well as a greater thermal mass than the overall thermal mass of the chamber liner 124. For example, at similar points 302 at the inner surface 301 of the conventional liner 300 and at the inner surface 200 of the chamber liner 124, the graph 304 shows the difference in the amount the temperature rises in relation to time between the two chamber liners. Curve 306 represents the temperature rise in relation to time in the conventional liner 300 while curve 308 represents the temperature rise in relation to time in chamber liner 124. As shown by the curves 306 and 308, the temperature rises more rapidly in relation to time in the chamber liner 124 than in the conventional liner 300. As described above, this is due to the lower thermal mass of the inner portion 126 compared to the higher thermal mass of the conventional liner 300. Therefore, the two piece chamber liner 124 is more energy efficient, needing less energy to heat the processing chamber 100 during processing and cleaning, thus increasing throughput and reducing the cost of ownership.

Figure 4A:
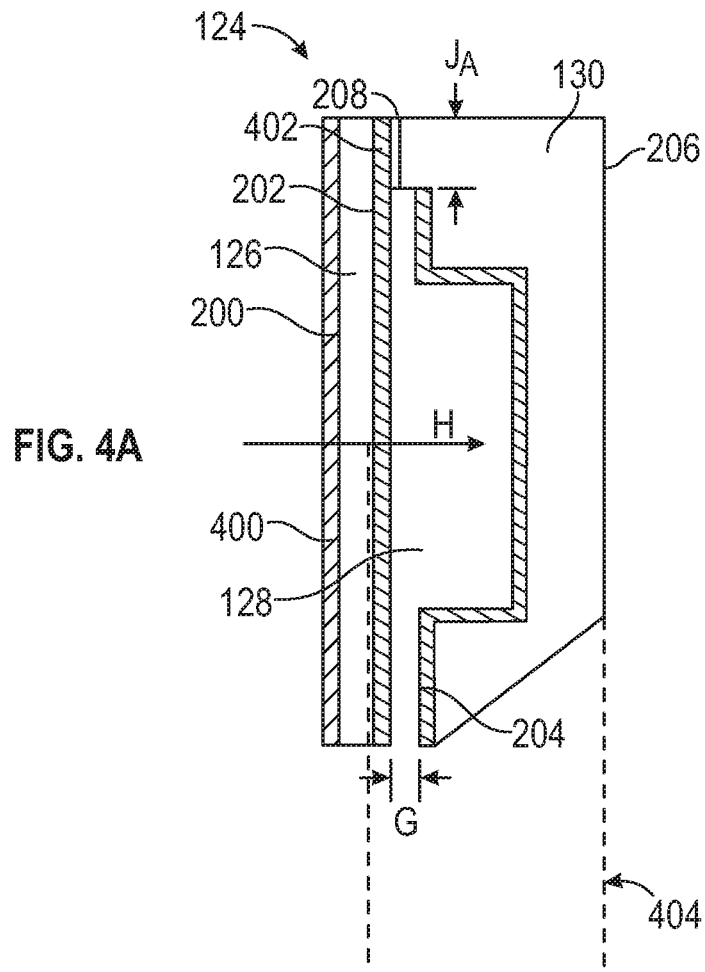
FIG. 4A is a sectional view of the liner of FIG. 1.
Figure 4B:
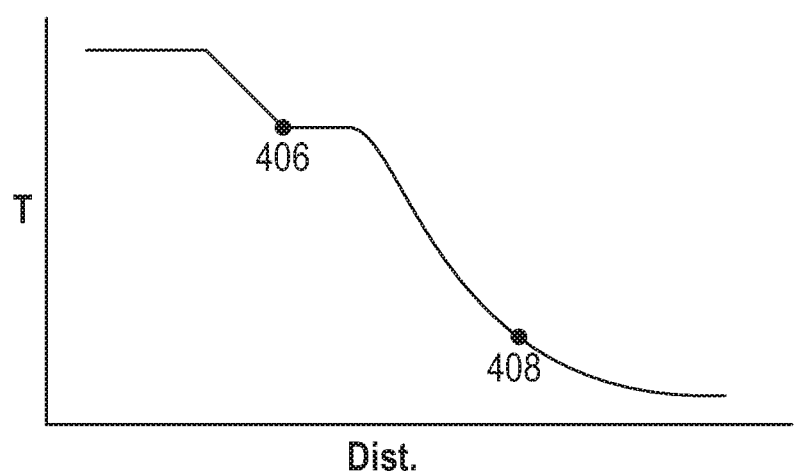
FIG. 4B is a schematic illustration related to the liner in FIG. 4A.

FIG. 4A is a sectional view of another embodiment of a chamber liner 124 described herein. This embodiment comprises the chamber liner 124 of FIG. 1 with coating materials added. For example, a first coating material 400 may be provided on the inner surface 200 of the inner portion 126. Additionally, a second coating material 402 may be provided on the outer surface 202 of the inner portion 126 and on the inner surface 204 of the outer portion 130. The first coating material 400 may be a material that increases emissivity for the inner surface 200. This material can have a high absorption coefficient, which will help the inner portion 126 absorb more heat, creating higher surface temperatures on the inner portion 126, leading to higher temperatures within the processing chamber 100, reducing clean time and energy efficiency. Examples of first coating materials that can be used are graphite with a Silicon Carbide (SiC) coating, or other similar materials. Conversely, the second coating material 402 may be a highly reflective material that absorbs less heat (thus having a low absorption coefficient). This helps the outer portion 130 absorb less heat, reducing the temperature to the base ring 132. Therefore, the amount of cooling water applied through the cooling water channel 107 (as shown in FIG. 1) to cool the base ring 132 can be reduced. This also provides the advance of saving energy, thus reducing the cost of ownership. Examples of second coating materials that can be used are flame polished quartz, hereaus reflective coating, or other similar materials. FIG. 4B provides a graph 404 showing how the temperature can change across the distance of the chamber liner 124 in the embodiment shown in FIG. 4A. As shown, a point 406 corresponds to a temperature near the inner surface 200 of the inner portion 126 and a point 408 corresponds to a temperature near the outer surface 206 of the outer portion 130. The temperature drops significantly between the point 406 and the point 408, showing the high amount of heat that is absorbed by the inner portion 126 and the high amount of heat that is reflected by the outer portion 130.

While the foregoing is directed to embodiments of the present disclosure, other and further embodiments of the disclosure may be devised without departing from the basic scope thereof, and the scope thereof is determined by the claims that follow.

We claim:

1. A liner for a processing chamber, comprising: an outer portion with an inner surface and an outer surface; an inner portion with an inner surface and an outer surface; a first coating material disposed on at least a portion of the inner surface of the inner portion; and a second coating material disposed on at least a portion of the outer surface of the inner portion and on at least a portion of the inner surface of the outer portion; wherein a portion of the inner surface of the outer portion is in contact with the outer surface of the inner portion and at least one junction point having a contact area between the portion of the inner surface of the outer portion and the outer surface of the inner portion; and the first coating material has a higher absorption coefficient than the second coating material.

2. The liner of claim 1, wherein the first coating material is SiC.

3. The liner of claim 1, wherein the second coating material is flame polished quartz.

4. The liner of claim 1, wherein the first coating material is SiC and the second coating material flame polished quartz.

5. The liner of claim 1, wherein the contact area is less than a non-contact area between the inner surface of the outer portion and the outer surface of the inner portion.

6. The liner of claim 5, wherein the contact area is less than 10% the non-contact area.

7. The liner of claim 1, wherein the inner portion and the outer portion are at least partially separated by a gap.

8. The liner of claim 1, wherein the inner portion and the outer portion are made of quartz.

9. A processing chamber, comprising: a substrate support assembly within a chamber body designed to support a substrate; at least one lamp designed to heat the substrate disposed on the substrate support; a cooling channel configured to receive a cooling fluid into the chamber body; a liner, the liner comprising: an outer portion with an inner surface and an outer surface; an inner portion with an inner surface and an outer surface; a first coating material disposed on at least a portion of the inner surface of the inner portion; and a second coating material disposed on at least a portion of the outer surface of the inner portion and on at least a portion of the inner surface of the outer portion; wherein a portion of the inner surface of the outer portion is in thermal contact with the outer surface of the inner portion at at least one junction point having a contact area between the portion of the inner surface of the outer portion and the outer surface of the inner portion; and the inner portion has a first thermal mass and the outer portion has a second thermal mass, and the first thermal mass is less than the second thermal mass; and the first coating material having a higher absorption coefficient than the second coating material.

10. The processing chamber of claim 9, wherein the contact area is less than a non-contact area between the inner surface of the outer portion and the outer surface of the inner portion.

11. The processing chamber of claim 10, wherein the contact area is less than 10% the non-contact area.

12. The processing chamber of claim 9, wherein the first coating material is SiC and the second coating material is flame polished quartz.

13. The processing chamber of claim 9, wherein the inner portion and the outer portion are at least partially separated by a gap.

14. The processing chamber of claim 9, wherein the outer surface of the outer portion is deposited on a portion of a base ring.

15. The processing chamber of claim 9, wherein the processing chamber is an epitaxial chamber.

* * * * *